United States Patent
Lu et al.

(10) Patent No.: US 10,775,678 B1
(45) Date of Patent: Sep. 15, 2020

(54) DISPLAY PANEL

(71) Applicant: Au Optronics Corporation, Hsinchu (TW)

(72) Inventors: Shao-Ping Lu, Hsinchu (TW); Chia-Wei Kuo, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/441,004

(22) Filed: Jun. 14, 2019

(30) Foreign Application Priority Data

Mar. 28, 2019 (TW) .............................. 108110922 A

(51) Int. Cl.
  *G06F 3/042* (2006.01)
  *G02F 1/29* (2006.01)
  *H01L 27/144* (2006.01)
  *G06F 3/041* (2006.01)

(52) U.S. Cl.
  CPC ............... *G02F 1/29* (2013.01); *G06F 3/042* (2013.01); *G06F 3/0412* (2013.01); *H01L 27/1443* (2013.01); *G02F 2001/294* (2013.01); *G02F 2201/121* (2013.01); *G02F 2201/123* (2013.01)

(58) Field of Classification Search
  CPC ............... G02F 1/29; G02F 2001/294; G02F 2201/121; G02F 2201/123; G06F 3/0412; G06F 3/042; H01L 27/1443
  See application file for complete search history.

(56) References Cited

U.S. PATENT DOCUMENTS

| | | | |
|---|---|---|---|
| 8,681,291 B2 | 3/2014 | Takama et al. | |
| 8,941,617 B2* | 1/2015 | Koyama | G02F 1/13338 178/18.01 |
| 9,285,921 B2* | 3/2016 | Ahn | G02F 1/13338 |
| 2005/0231656 A1* | 10/2005 | den Boer | H01L 27/14609 349/42 |
| 2008/0185501 A1* | 8/2008 | Kunimori | G02F 1/13318 250/214 AL |
| 2009/0086137 A1* | 4/2009 | Horiguchi | G02F 1/13454 349/116 |

(Continued)

FOREIGN PATENT DOCUMENTS

| | | |
|---|---|---|
| CN | 102037395 | 4/2011 |
| CN | 107315300 | 11/2017 |

*Primary Examiner* — Hoan C Nguyen
(74) *Attorney, Agent, or Firm* — JCIPRNET

(57) ABSTRACT

A display panel includes a first substrate, a second substrate, pixel structures, a sensing structure, a display medium layer, a first control structure, a second control structure, and color filter patterns. The sensing structure includes a first photosensor and a second photosensor. The display medium layer disposed between the first substrate and the second substrate includes a first modulation portion overlapping a first sensing active device of the first photosensor and a second modulation portion overlapping a second sensing active device of the second photosensor. The first control structure is disposed between the first substrate and the display medium layer. The second control structure is disposed between the second substrate and the display medium layer. The first sensing active device and the second sensing active device respectively overlap a first color filter pattern and a second color filter pattern among the color filter patterns.

20 Claims, 9 Drawing Sheets

(56) References Cited

U.S. PATENT DOCUMENTS

2009/0289910 A1* 11/2009 Hattori ................ G02F 1/13338
 345/173
2011/0069254 A1 3/2011 Takama et al.
2011/0221722 A1* 9/2011 Yoshida ................ G02F 1/1362
 345/206
2011/0234536 A1* 9/2011 Yeo .................... G02F 1/13338
 345/175

* cited by examiner

DISPLAY PANEL

CROSS-REFERENCE TO RELATED APPLICATION

This application claims the priority benefit of Taiwan application serial no. 108110922, filed on Mar. 28, 2019. The entirety of the above-mentioned patent application is hereby incorporated by reference herein and made a part of this specification.

BACKGROUND

Technical Field

The disclosure relates to a display panel, and more particularly to a display panel having a sensing function.

Related Art

In recent years, the touch function has gradually become an indispensable part of many daily life applications, especially mobile devices equipped with touch display panels, such as smartphones and tablets which can be seen everywhere. According to how the touch technology is integrated into display panels, the touch display technology may be classified into out-cell, on-cell and in-cell. Among them, the in-cell touch technology has an advantage of easy minimization of thickness and therefore has gradually become the mainstream of touch display panels.

Further, according to different architectures and driving modes, sensing technology of the in-cell touch may further be classified into self-capacitance type, mutual-capacitance type and optical type, wherein application of the optical-type touch-sensing technology to large-size touch display panels is commercially popular due to its cost advantage. In an optical-type touch display panel, since it is necessary to integrate a photosensor into an in-cell touch display panel, an aperture ratio of display pixels is significantly reduced. Therefore, how to reduce arrangement space required for the photosensor without sacrificing sensing sensitivity and stability has become an important subject for related manufacturers.

SUMMARY

The disclosure provides a display panel having a photosensor and having high sensing sensitivity and good stability.

A display panel of the disclosure has a plurality of pixel areas, and includes a first substrate, a second substrate, a plurality of pixel structures, a sensing structure, a display medium layer, a first control structure, a second control structure, and a plurality of color filter patterns. The second substrate is disposed opposing the first substrate. The pixel structures are disposed on the first substrate and respectively located in the pixel areas. The sensing structure is disposed on the first substrate and includes a first photosensor and a second photosensor. The first photosensor includes a first sensing active device located in one of the pixel areas. The second photosensor includes a second sensing active device located in another of the pixel areas. The display medium layer is disposed between the first substrate and the second substrate, and includes a display portion overlapping the pixel structures, a first modulation portion overlapping the first sensing active device, and a second modulation portion overlapping the second sensing active device. The first control structure is disposed between the first substrate and the display medium layer and located on a periphery of the first modulation portion. The second control structure is disposed between the second substrate and the display medium layer and located on a periphery of the second modulation portion. The color filter patterns are disposed in the pixel areas. The first sensing active device overlaps a first color filter pattern among the color filter patterns, and the second sensing active device overlaps a second color filter pattern among the color filter patterns.

A display panel of the disclosure has a plurality of pixel areas, and includes a first substrate, a second substrate, a plurality of pixel structures, a photosensor, a display medium layer, a first control structure, a second control structure, and a plurality of color filter patterns. The second substrate is disposed opposing the first substrate. The pixel structures are disposed on the first substrate and respectively located in the pixel areas. The photosensor is disposed on the first substrate, and has a sensing active device located in one of the pixel areas and a compensation active device located in another of the pixel areas. The sensing active device is electrically connected to the compensation active device. The display medium layer is disposed between the first substrate and the second substrate, and includes a display portion overlapping the pixel structures, a first modulation portion overlapping the sensing active device, and a second modulation portion overlapping the compensation active device. The first control structure is disposed between the first substrate and the display medium layer and located on a periphery of the first modulation portion. The second control structure is disposed between the second substrate and the display medium layer and located on a periphery of the second modulation portion. The color filter patterns are disposed in the pixel areas. The sensing active device overlaps a first color filter pattern among the color filter patterns, and the compensation active device overlaps a second color filter pattern among the color filter patterns.

A display panel of the disclosure has a plurality of pixel areas, and includes a first substrate, a second substrate, a plurality of pixel structures, a photosensor, a display medium layer, a control structure, and a plurality of color filter patterns. The second substrate is disposed opposing the first substrate. The pixel structures are disposed on the first substrate and respectively located in the pixel areas. The photosensor is disposed on the first substrate, and has a sensing active device located in one of the pixel areas. The display medium layer is disposed between the first substrate and the second substrate, and includes a display portion overlapping the pixel structures and a modulation portion overlapping the sensing active device. The control structure includes a first control electrode, a second control electrode, a third control electrode and a fourth control electrode. The first control electrode and the second control electrode are disposed between the first substrate and the display medium layer. The third control electrode and the fourth control electrode are disposed between the second substrate and the display medium layer. The modulation portion is located between the first control electrode and the second control electrode, and the modulation portion is located between the third control electrode and the fourth control electrode. The color filter patterns are disposed in the pixel areas, and the modulation portion overlaps one of the color filter patterns.

Based on the above, the display panel according to an embodiment of the disclosure has two active devices disposed respectively in two pixel areas and used to sense a light beam. These two active devices are, for example, two sensing active devices, or a combination of a sensing active device and a compensation active device. Moreover, two modulation portions of the display medium layer that overlap these two active devices are respectively driven by two control structures, wherein one of the modulation portions is used to provide a light focusing characteristic and the other modulation portion is used to provide a light diffusion characteristic. Accordingly, intensities of two light beams received by these two active devices can be adjusted respectively, which contributes to an improvement in a signal-to-noise ratio (SNR) of a sensing circuit and an increase in design margin of the sensing structure. In addition, in the display panel of another embodiment of the disclosure, the modulation portion of the display medium layer that overlaps the sensing active device is driven by the control structure on the first substrate and the second substrate, so that a light beam passing through this modulation portion diffuses and cannot be received by the sensing active device and the sensing active device is thus disabled. This contributes to an improvement in operational flexibility of the photosensor.

To make the above features and advantages of the disclosure more comprehensible, examples accompanied with drawings are described in detail as follows.

DESCRIPTION OF THE EMBODIMENTS

Figure 1:
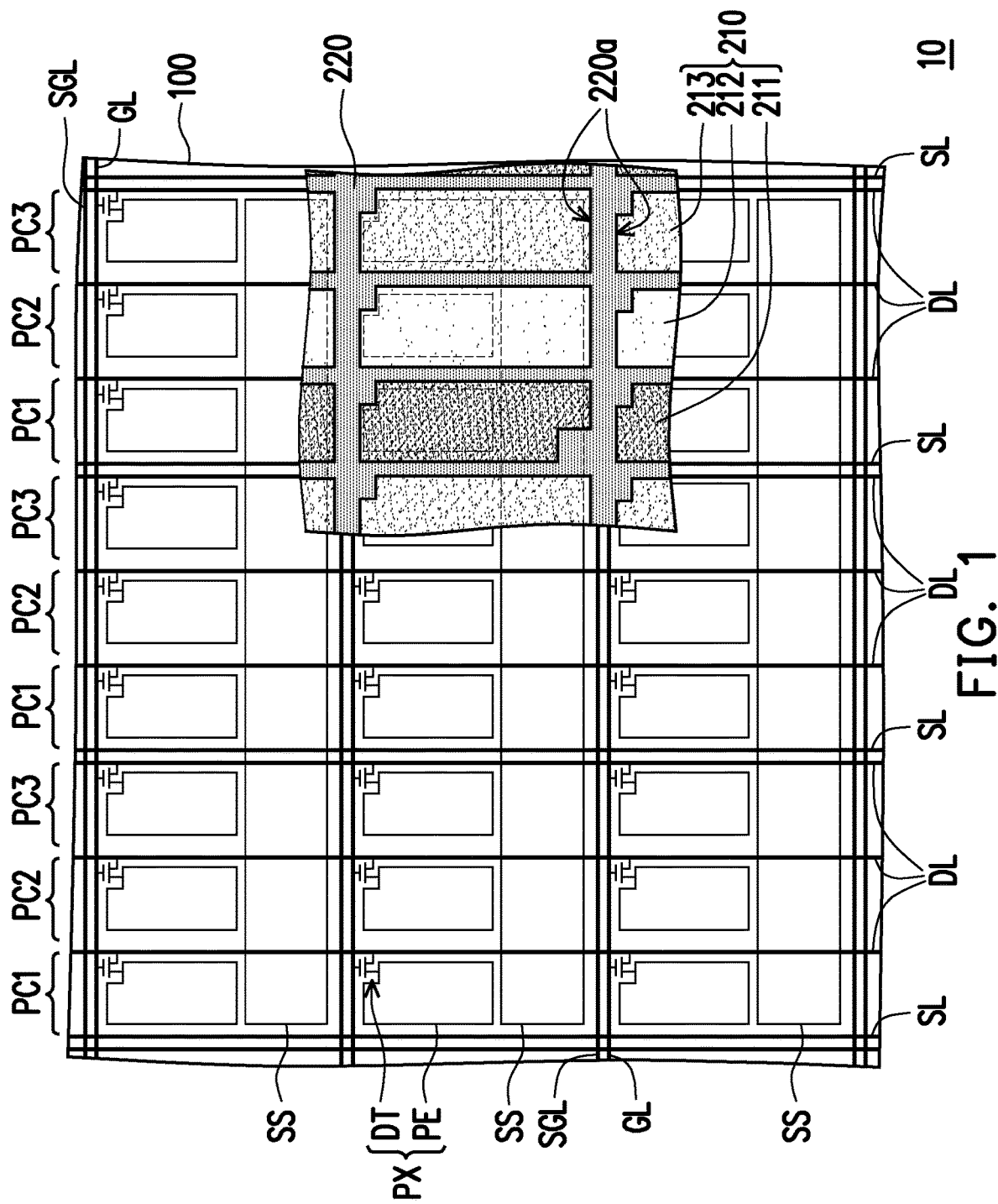
FIG. 1 is a schematic top view of a display panel according to a first embodiment of the disclosure.

The term "about," "approximately," "essentially" or "substantially" as used herein is inclusive of the stated value and means within an acceptable range of deviation for the particular value as determined by those of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on measurement properties, cutting properties or other properties, instead of applying one standard deviation across all the properties.

In the accompanying drawings, thicknesses of layers, films, panels, regions and so on are exaggerated for clarity. It will be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Moreover, "electrically connected" can encompass the presence of other elements between two elements.

In addition, relative terms such as "lower" or "bottom" and "upper" or "top" may be used herein to describe one element's relationship to another element as illustrated in the drawings. It will be understood that the relative terms are intended to encompass different orientations of a device in addition to the orientation depicted in the drawings. For example, if the device in one of the drawings is turned over, elements described as being on the "lower" side of other elements would then be oriented on "upper" sides of the other elements. The exemplary term "lower" can therefore encompass an orientation of "lower" and "upper," depending on the particular orientation of the drawing. Similarly, if the device in one of the drawings is turned over, elements described as "below" or "beneath" other elements would then be oriented "above" the other elements. The exemplary terms "below" or "beneath" can therefore encompass an orientation of above and below.

In the disclosure, to facilitate understanding, positions of a source and a drain in a transistor in the drawings are exemplary and not intended to be limiting. The reason is that the source and the drain in the transistor may change with current direction, or may differ depending on whether the transistor is an N-type metal-oxide-semiconductor (NMOS) transistor or a P-type metal-oxide-semiconductor (PMOS) transistor.

Reference will now be made in detail to exemplary embodiments of the disclosure, examples of which are illustrated in the accompanying drawings. Wherever possible, the same reference numerals are used in the drawings and the description to refer to the same or like portions.

Figure 2:
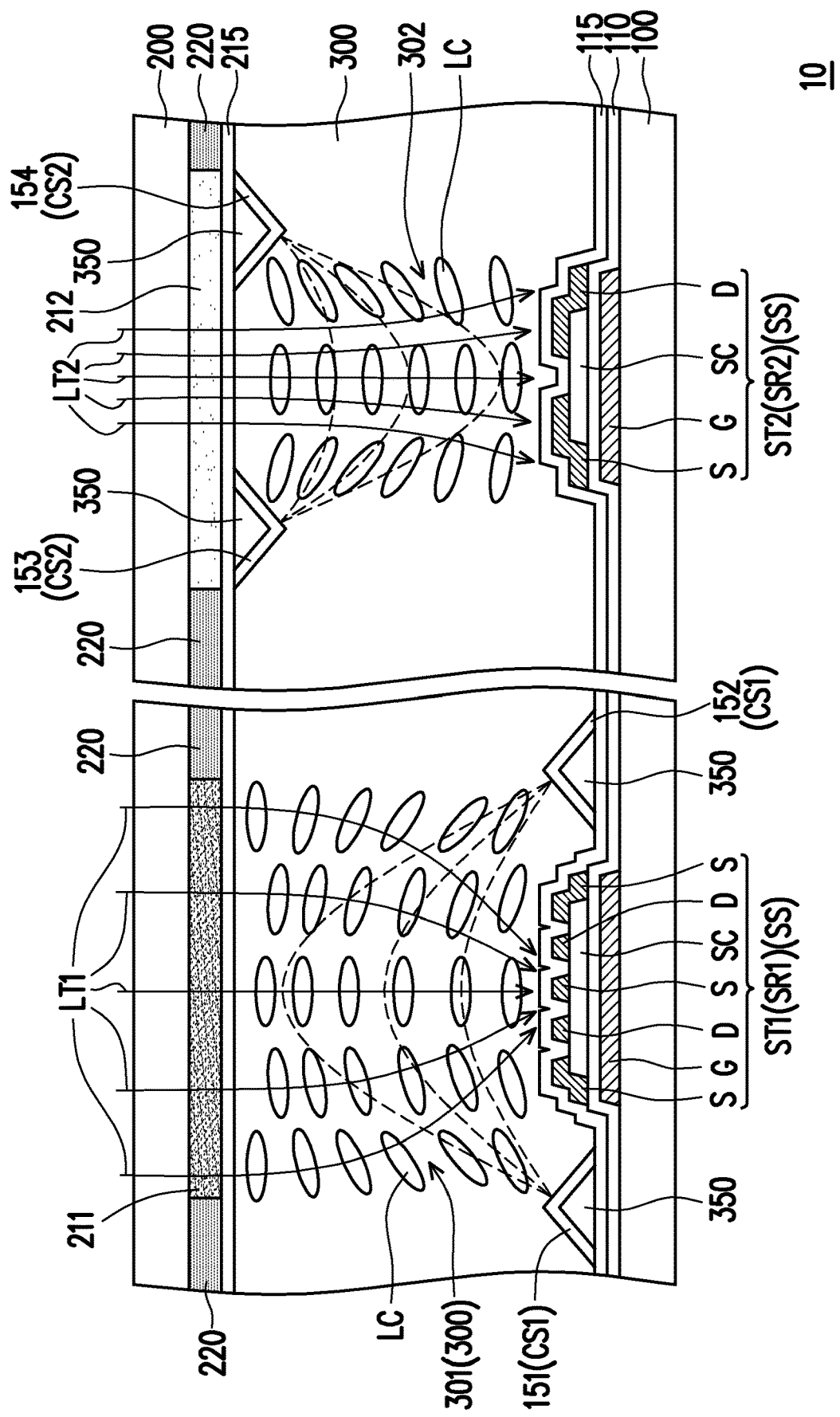
FIG. 2 is a schematic cross-sectional view of the display panel according to the first embodiment of the disclosure.
Figure 3:
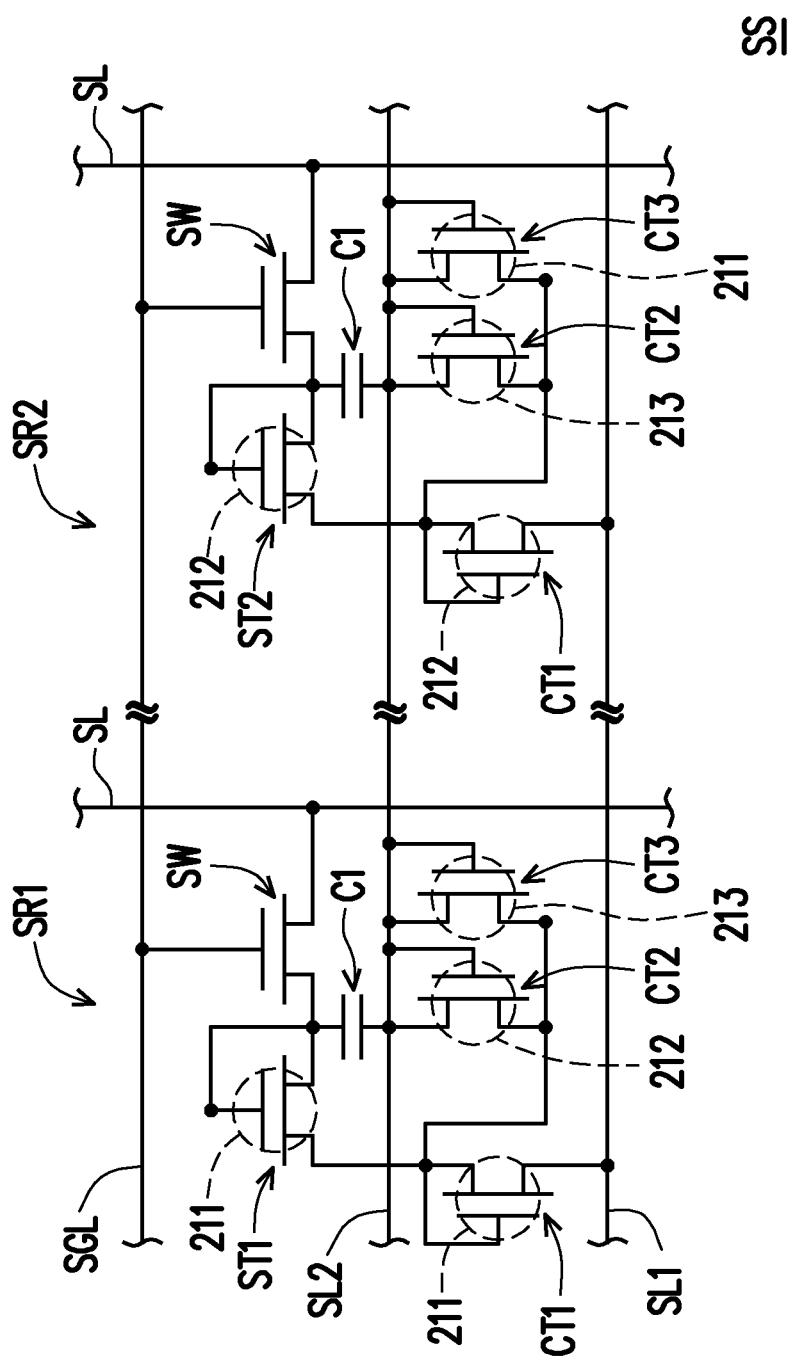
FIG. 3 is an equivalent circuit diagram of a sensing structure according to the first embodiment of the disclosure.
Figure 4:
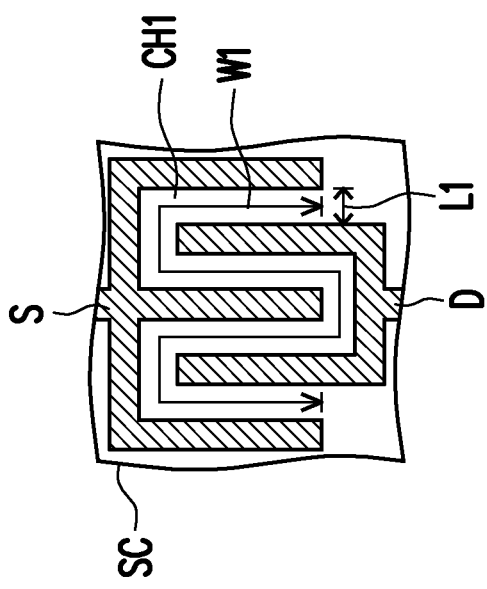
FIG. 4 is a schematic top view of a first sensing active device of FIG. 2.
Figure 6:
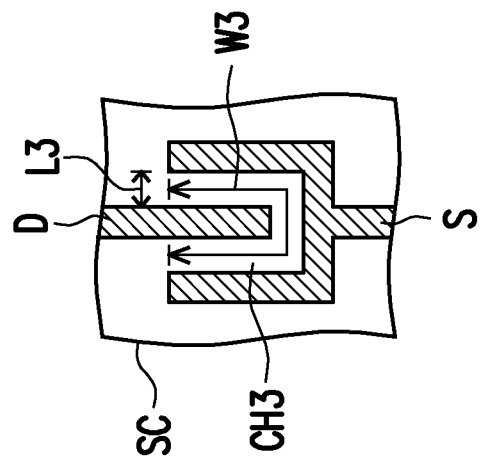
FIG. 6 is a schematic top view of a display active device of FIG. 1.
Figure 5:
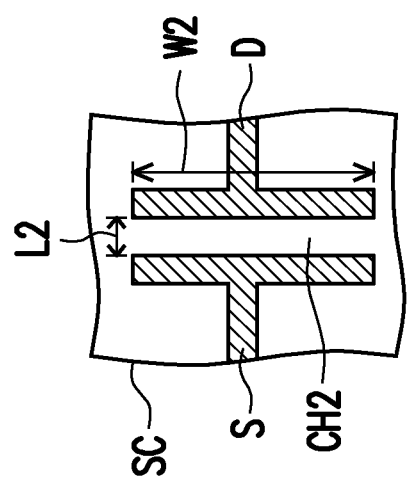
FIG. 5 is a schematic top view of a second sensing active device of FIG. 2.

FIG. 1 is a schematic top view of a display panel according to a first embodiment of the disclosure. FIG. 2 is a schematic cross-sectional view of the display panel according to the first embodiment of the disclosure. FIG. 3 is an equivalent circuit diagram of a sensing structure according to the first embodiment of the disclosure. FIG. 4 is a schematic top view of a first sensing active device of FIG. 2. FIG. 5 is a schematic top view of a second sensing active device of FIG. 2. FIG. 6 is a schematic top view of a display active device of FIG. 1. It is to be noted that, for the sake of clarity, FIG. 1 omits illustration of a second substrate 200, a first sensing active device ST1, a second sensing active device ST2, a first control structure CS1, a second control structure CS2, a protruding structure 350, a gate insulating layer 110, a first insulating layer 115 and a second insulating layer 215 of FIG. 2; FIG. 4 and FIG. 5 omit illustration of a gate the gate insulating layer 110, the first insulating layer 115 and the second insulating layer 215 of FIG. 2.

Referring to FIG. 1 and FIG. 2, a display panel 10 includes a first substrate 100, the second substrate 200 and a display medium layer 300. The first substrate 100 is disposed opposing the second substrate 200, and the display medium layer 300 is sandwiched between the first substrate 100 and the second substrate 200. For example, the display medium layer 300 may include a plurality of liquid crystal molecules LC, that is, the display panel 10 may be a liquid crystal display panel. However, in some embodiments, the display medium layer 300 may also include an electrophoretic ink, that is, the display panel may also be an electronic paper display panel. In the present embodiment, the first substrate 100 and the second substrate 200 are, for example, transparent substrates, and a material of the transparent substrates may include glass, quartz, an organic polymer, or other applicable material.

Further, the display panel 10 further includes a plurality of data lines DL, a plurality of scan lines GL and a plurality of pixel structures PX. The data lines DL and the scan lines GL are disposed on the first substrate 100, and the data lines DL intersect the scan lines GL to define a plurality of pixel areas PA of the display panel 10. The pixel structures PX are respectively located in the pixel areas PA, and each of the pixel structures PX has a display active device DT and a pixel electrode PE electrically connected to each other, wherein the display active device DT is electrically connected to a corresponding one of the scan lines GL and a corresponding one of the data lines DL.

On the other hand, the display panel 10 further includes a plurality of color filter patterns 210 and a light shielding pattern layer 220. The light shielding pattern layer 220 disposed on the second substrate 200 has a plurality of openings 220a corresponding to the pixel areas PA. The color filter patterns 210 are disposed in the openings 220a of the light shielding pattern layer 220 and respectively overlap the pixel structures PX. In the present embodiment, the color filter patterns 210 are selectively disposed between the second substrate 200 and the display medium layer 300, but the disclosure is not limited thereto. In some embodiments, the color filter patterns 210 may be disposed between the first substrate 100 and the display medium layer 300.

In the present embodiment, the pixel structures PX may be arranged into a plurality of first pixel strings PC1, a plurality of second pixel strings PC2, and a plurality of third pixel strings PC3 in a direction D1, and the color filter patterns 210 include a plurality of first color filter patterns 211 overlapping the first pixel strings PC1, a plurality of second color filter patterns 212 overlapping the second pixel strings PC2, and a plurality of third color filter patterns 213 overlapping the third pixel strings PC3. For example, color of the first color filter patterns 211 may be red, color of the second color filter patterns 212 may be one of green and blue, and color of the third color filter patterns 213 is the other of green and blue. However, the disclosure is not limited thereto. In the present embodiment, the color filter patterns 210 having the same color are disposed in a stripe arrangement on the second substrate 200 (as shown in FIG. 1), but the disclosure is not limited thereto. In other embodiments, the color filter patterns 210 having the same color may be disposed in a mosaic arrangement on the second substrate 200.

In order to sense a light beam emitted by an external light source (e.g., an optical stylus), the display panel 10 further includes a plurality of sensing scan lines SGL, a plurality of sensing lines SL and a sensing structure SS, wherein the sensing scan lines SGL and the sensing lines SL may be parallel to the scan lines GL and the data lines DL, respectively, and the sensing structure SS is electrically connected to the sensing scan lines SGL and the sensing lines SL. In the present embodiment, the sensing structure SS may be disposed in a divided manner in the pixel areas PA; that is, a local area of each pixel area PA is provided with a different portion of the sensing structure SS. However, the disclosure is not limited thereto. In other embodiments, the sensing structure SS may be disposed in a divided manner in only some of the pixel areas PA.

Referring to FIG. 2 and FIG. 3, the sensing structure SS includes a first photosensor SR1 and a second photosensor SR2 electrically independent of each other. The first photosensor SR1 and the second photosensor SR2 respectively have the first sensing active device ST1 and the second sensing active device ST2 located in different pixel strings. In the present embodiment, the first sensing active device ST1 overlaps the first color filter pattern 211 in a normal direction of the first substrate 100, and the second sensing active device ST2 overlaps the second color filter pattern 212 or the third color filter pattern 213 in the normal direction of the first substrate 100. In other words, the first sensing active device ST1 is disposed in an area occupied by the first pixel string PC1, and the second sensing active device ST2 is disposed in an area occupied by the second pixel string PC2 or the third pixel string PC3. It is to be noted that, in the present embodiment, an exemplary description is provided of an example in which the number of the photosensors is two, and the disclosure is not limited to the content disclosed in the drawings.

For example, to avoid additional production costs, the first sensing active device ST1, the second sensing active device ST2 and the display active device DT may be formed in the same manufacturing process, and a forming method may include the following steps. The gate the gate insulating layer 110, a semiconductor pattern SC, a source S, a drain D and an insulating layer 120 are sequentially formed on the first substrate 100, wherein the source S and the drain D are respectively electrically connected to two different areas of the semiconductor pattern SC. Particularly, in the present embodiment, the gate G of an active device (i.e., the first sensing active device ST1, the second sensing active device ST2, or the display active device DT) is disposed between the semiconductor pattern SC and the first substrate 100, that is, the active device of the present embodiment is a bottom-gate thin film transistor (TFT). Accordingly, two semiconductor patterns SC of the first sensing active device ST1 and the second sensing active device ST2 can be irradiated with an external light beam incident from the second substrate 200 and passing through the display medium layer 300, and generate a photocurrent. On the other hand, since the light shielding pattern layer 220 overlaps the display active device DT in the normal direction of the first substrate 100, the external light beam incident from the second substrate 200 can be effectively blocked from directly irradiating the semiconductor pattern SC of the display active device DT, thus helping ensure electrical characteristics of the display active device DT.

In the present embodiment, the semiconductor pattern SC, the gate insulating layer 110, the gate the source S and the drain D may respectively be implemented by any semiconductor pattern, any gate insulating layer, any gate, any source and any drain for a display panel known to those of ordinary skill in the art. Moreover, the semiconductor pattern SC, the gate insulating layer 110, the gate the source S and the drain D may respectively be formed by any method known to those of ordinary skill in the art. On the other hand, the active device of the present embodiment is, for example, an amorphous silicon thin film transistor (a-Si TFT). However, the disclosure is not limited thereto. In other embodiments, the active device may be a low temperature polysilicon thin film transistor (LTPS TFT), a microcrystalline silicon thin film transistor (micro-Si TFT) or a metal oxide transistor.

Figure 10:
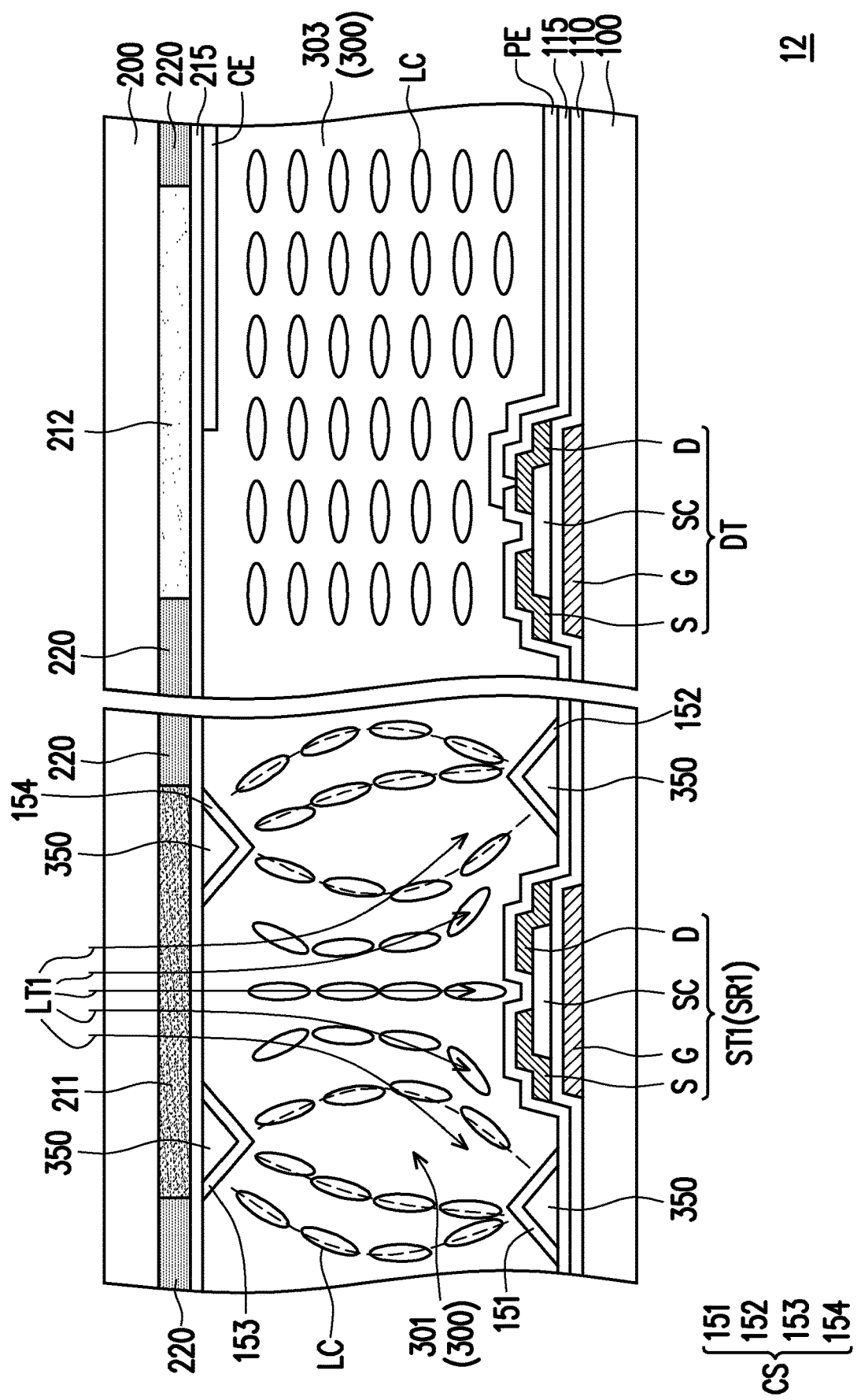

Referring to FIG. 2, the display panel 10 further includes the first control structure CS1 and the second control structure CS2, wherein the first control structure CS1 is disposed between the first substrate 100 and the display medium layer 300, and the second control structure CS2 is disposed between the second substrate 100 and the display medium layer 300. In the present embodiment, the first insulating layer 115 may be provided between the first control structure CS1 and the gate insulating layer 110, and the second insulating layer 215 may be provided between the second control structure CS2 and the color filter pattern 210 (or the light shielding pattern layer 220). However, the disclosure is not limited thereto. On the other hand, the display medium layer 300 includes a first modulation portion 301 overlapping the first sensing active device ST1, a second modulation portion 302 overlapping the second sensing active device ST2, and a display portion 303 (as shown in FIG. 10) overlapping the pixel structures PX, wherein the first control structure CS1 is located on a periphery of the first modulation portion 301, and the second control structure CS2 is located on a periphery of the second modulation portion 302. Particularly, the first control structure CS1 is adapted to drive the first modulation portion 301 so that the first modulation portion 301 has a light focusing characteristic, and the second control structure CS2 is adapted to drive the second modulation portion 302 so that the second modulation portion 302 has a light diffusion characteristic.

For example, the first control structure CS1 may include a first control electrode 151 and a second control electrode 152, and the first modulation portion 301 of the display medium layer 300 is located between the first control electrode 151 and the second control electrode 152; similarly, the second control structure CS2 may include a third control electrode 153 and a fourth control electrode 154, and the second modulation portion 302 of the display medium layer 300 is located between the third control electrode 153 and the fourth control electrode 154. In the present embodiment, the liquid crystal molecules LC of the display medium layer 300 are, for example, positive liquid crystal molecules, that is, an optical axis (long axis) of the liquid crystal molecules LC tend to be arranged in an electric field direction. However, the disclosure is not limited thereto. According to other embodiments, the liquid crystal molecules LC of the display medium layer 300 may also be negative liquid crystal molecules.

Specifically, when the sensing structure SS of the display panel 10 is enabled, an electric field distribution is formed above the first sensing active device ST1 due to a potential difference between the first control electrode 151 and the second control electrode 152. This electric field distribution drives the liquid crystal molecules LC of the first modulation portion 301 of the display medium layer 300 to tend to be arranged in an extension direction of a power line (as shown by dash lines in FIG. 2) to form a first liquid crystal lens having a light focusing function. That is, the first liquid crystal lens may be analogous to a convex lens, and this convex lens has a convex surface facing the second substrate 200. On the other hand, another electric field distribution is formed above the second sensing active device ST2 due to another potential difference between the third control electrode 153 and the fourth control electrode 154. This electric field distribution drives the liquid crystal molecules LC of the second modulation portion 302 of the display medium layer 300 to tend to be arranged in the extension direction of the power line (as shown by dash lines in FIG. 2) to form a second liquid crystal lens having a light diffusion function. That is, the second liquid crystal lens may be analogous to a concave lens, and this concave lens has a concave surface facing the second substrate 200.

Further, as shown in FIG. 2, a partial light beam LT1 of the external light beam incident from a side of the second substrate 200 away from the first substrate 100 forms a red light beam after passing through the first color filter pattern 211, and another partial light beam LT2 forms a green light beam (or blue light beam) after passing through the second color filter pattern 212, wherein the red light beam, after passing through the first modulation portion 301 having the light focusing characteristic, irradiates a portion of the semiconductor pattern SC of the first sensing active device ST1 exposed by the source S and the drain D to generate a first photocurrent, and the green light beam (or blue light beam), after passing through the second modulation portion 302 having the light diffusion characteristic, irradiates a portion of the semiconductor pattern SC of the second sensing active device ST2 exposed by the source S and the drain D to generate a second photocurrent. That is, the magnitude of the photocurrent formed by the sensing active device under irradiation with the external light beam can be controlled by the liquid crystal lens formed by the modulation portion of the display medium layer 300 under driving by an electric field.

For example, when the light beam (e.g., red light beam) irradiating the first sensing active device ST1 has a relatively weak intensity, the intensity of the light beam irradiating the semiconductor pattern SC can be increased by the first modulation portion 301 having the light focusing characteristic, so as to increase output of the first photocurrent. In contrast, when the light beam (e.g., green light beam or blue light beam) irradiating the second sensing active device ST2 has a relatively strong intensity, the intensity of the light beam irradiating the semiconductor pattern SC can be reduced by the second modulation portion 302 having the light diffusion characteristic, so as to decrease output of the second photocurrent. In other words, the intensities of the external light beam received by the first sensing active device ST1 and the second sensing active device ST2 can be adjusted respectively so that the photocurrents generated by the first sensing active device ST1 and the second sensing active device ST2 have matching magnitudes. In this way, a signal-to-noise ratio (SNR) of a sensing circuit can be improved.

From another point of view, a semiconductor material for absorbing photons and generating a photocurrent has different quantum efficiencies with respect to light of different wavelengths. Therefore, size of a channel of the sensing active device needs to be adjusted according to a wavelength of a light beam to be detected, so that matching photocurrents can be generated after the channel is irradiated with the light of different wavelengths. In other words, by increasing an intensity of light irradiating the semiconductor pattern SC by utilizing the light focusing characteristic of the liquid crystal lens, arrangement space required for the sensing active device can be effectively reduced, and design margin of the sensing structure can be easily increased.

Referring to FIG. 4, FIG. 5 and FIG. 6, in the present embodiment, the first sensing active device ST1, the second sensing active device ST2, and the display active device DT respectively have a first channel CH1, a second channel CH2, and a third channel CH3, wherein a ratio of a width W1 to a length L1 of the first channel CH1 is greater than a ratio of a width W2 to a length L2 of the second channel CH2, and the ratio of the width W2 to the length L2 of the second channel CH2 is greater than a ratio of a width W3 to a length L3 of the third channel CH3. In some embodiments, a ratio of the width-to-length ratio W1/L1 of the first channel CH1 to the width-to-length ratio W3/L3 of the third channel CH3 may be between 6 and 9, and a ratio of the width-to-length ratio W2/L2 of the second channel CH2 to the width-to-length ratio W3/L3 of the third channel CH3 may be between 1.5 and 2.25. In some other embodiments, the ratio of the width-to-length ratio W2/L2 of the second channel CH2 to the width-to-length ratio W3/L3 of the third channel CH3 may be between 4 and 6.

Further, as can be seen from FIG. 2, the display panel 10 further selectively includes a plurality of protruding structures 350. Some of the protruding structures 350 are disposed between the first control structure CS1 and the first insulating layer 115, and others of the protruding structures 350 are disposed between the second control structure CS2 and the second insulating layer 215. Particularly, by disposing the protruding structures 350, the liquid crystal molecules LC can be arranged in more diverse manners under driving by the control structure, so as to provide a light focusing effect or a light diffusion effect to different degrees.

On the other hand, as can be seen from FIG. 3, the photosensor (e.g., the first photosensor SR1 and the second photosensor SR2) may further have a switch active device SW, a first compensation active device CT1, a second compensation active device CT2, a third compensation active device CT3 and a capacitor C1, wherein the switch active device SW is electrically connected to a corresponding one of the sensing lines SL and a corresponding one of the sensing scan lines SGL, and the sensing active device (e.g., the first sensing active device ST1 and the second sensing active device ST2) is electrically connected to the first compensation active device CT1, the second compensation active device CT2, the third compensation active device CT3 and the capacitor C1.

It is worth mentioning that, the first compensation active device CT1, the second compensation active device CT2 and the third compensation active device CT3 may respectively overlap three color filter patterns 210 having different colors (e.g., red, blue and green), and the color of the color filter pattern 210 overlapped by the first compensation active device CT1 is the same as the color of the color filter pattern 210 overlapped by the sensing active device (e.g., the first sensing active device ST1 or the second sensing active device ST2). In the present embodiment, the display panel 10 further selectively includes a first signal line SL1 and a second signal line SL2, wherein the first compensation active device CT1 is electrically connected to the first signal line SL1, and the second signal line SL2 is electrically connected to the second compensation active device CT2, the third compensation active device CT3 and the capacitor C1. For example, the first signal line SL1 and the second signal line SL2 may respectively be used to transmit a sensing signal and a voltage signal.

Figure 7:
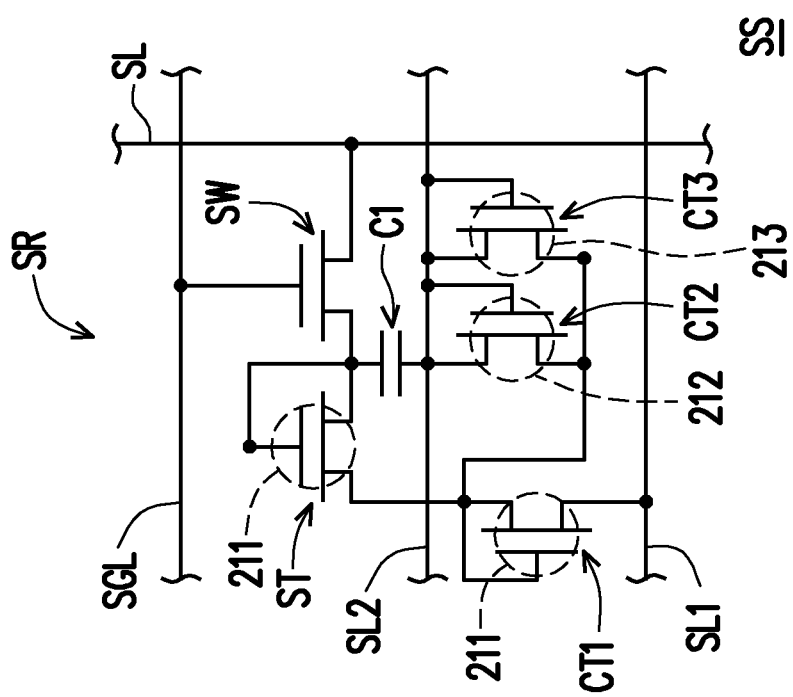
FIG. 7 is an equivalent circuit diagram of a sensing structure according to a second embodiment of the disclosure.
Figure 8:
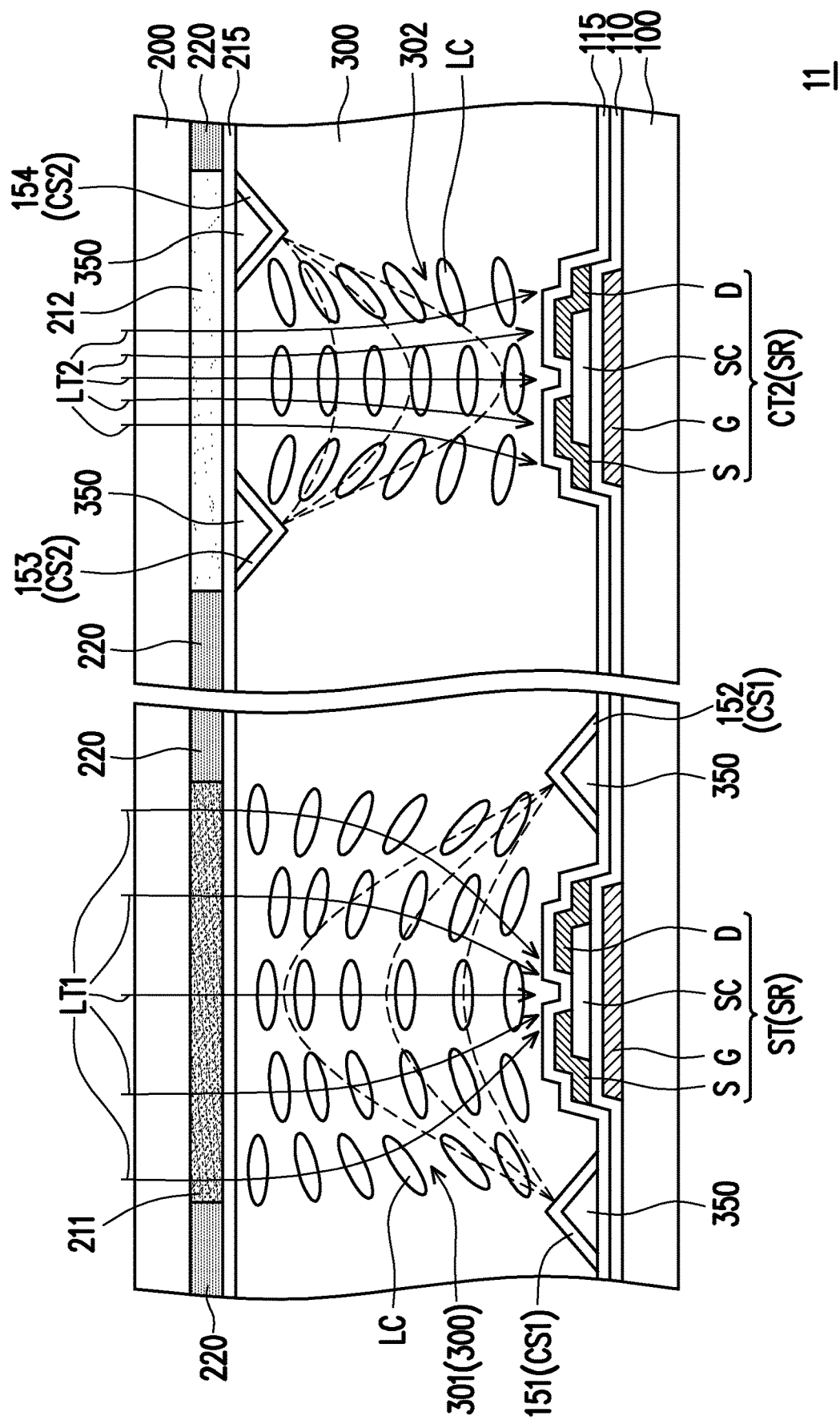
FIG. 8 is a schematic cross-sectional view of a display panel according to the second embodiment of the disclosure.

FIG. 7 is an equivalent circuit diagram of a sensing structure according to a second embodiment of the disclosure. FIG. 8 is a schematic cross-sectional view of a display panel according to the second embodiment of the disclosure. Referring to FIG. 7 and FIG. 8, a display panel 11 of the present embodiment mainly differs from the display panel 10 of the aforesaid embodiment in that the second control structure CS2 of the display panel 11 is configured at a different location. In the present embodiment, a sensing active device ST and the first compensation active device CT1 of a photosensor SR respectively overlap two first color filter patterns 211 in the normal direction of the first substrate 100, and the second compensation active device CT2 overlaps the second color filter pattern 212 in the normal direction of the first substrate 100, wherein the color of the first color filter pattern 211 is one of green and blue, and the color of the second color filter pattern 212 is the other of green and blue.

In the present embodiment, the first modulation portion 301 and the second modulation portion 302 of the display medium layer 300 respectively overlap the sensing active device ST and the second compensation active device CT2. That is, the first modulation portion 301 is located between the first color filter pattern 211 and the sensing active device ST, and the second modulation portion 302 is located between the second color filter pattern 212 and the second compensation active device CT2. Particularly, when a wavelength range of the light beam to be detected covers wavelengths of blue light and green light, since the blue color filter pattern 210 cannot completely absorb a portion of the green light having a wavelength close to that of blue light (or, the green color filter pattern 210 cannot completely absorb a portion of the blue light having a wavelength close to that of green light), the second compensation active device CT2 generates a larger photocurrent and affects charging time of the capacitor C1, causing distortion of the photocurrent generated by the sensing active device ST. Therefore, an intensity of a light beam irradiating the second compensation active device CT2 can be reduced by the second modulation portion 302 (e.g., the liquid crystal lens formed by the liquid crystal molecules LC under driving by an electric field) having the light diffusion characteristic, thereby effectively suppressing the generation of photocurrent from the second compensation active device CT2. Accordingly, a more accurate numerical measurement can be performed on the photocurrent generated by the sensing active device ST.

Figure 9:
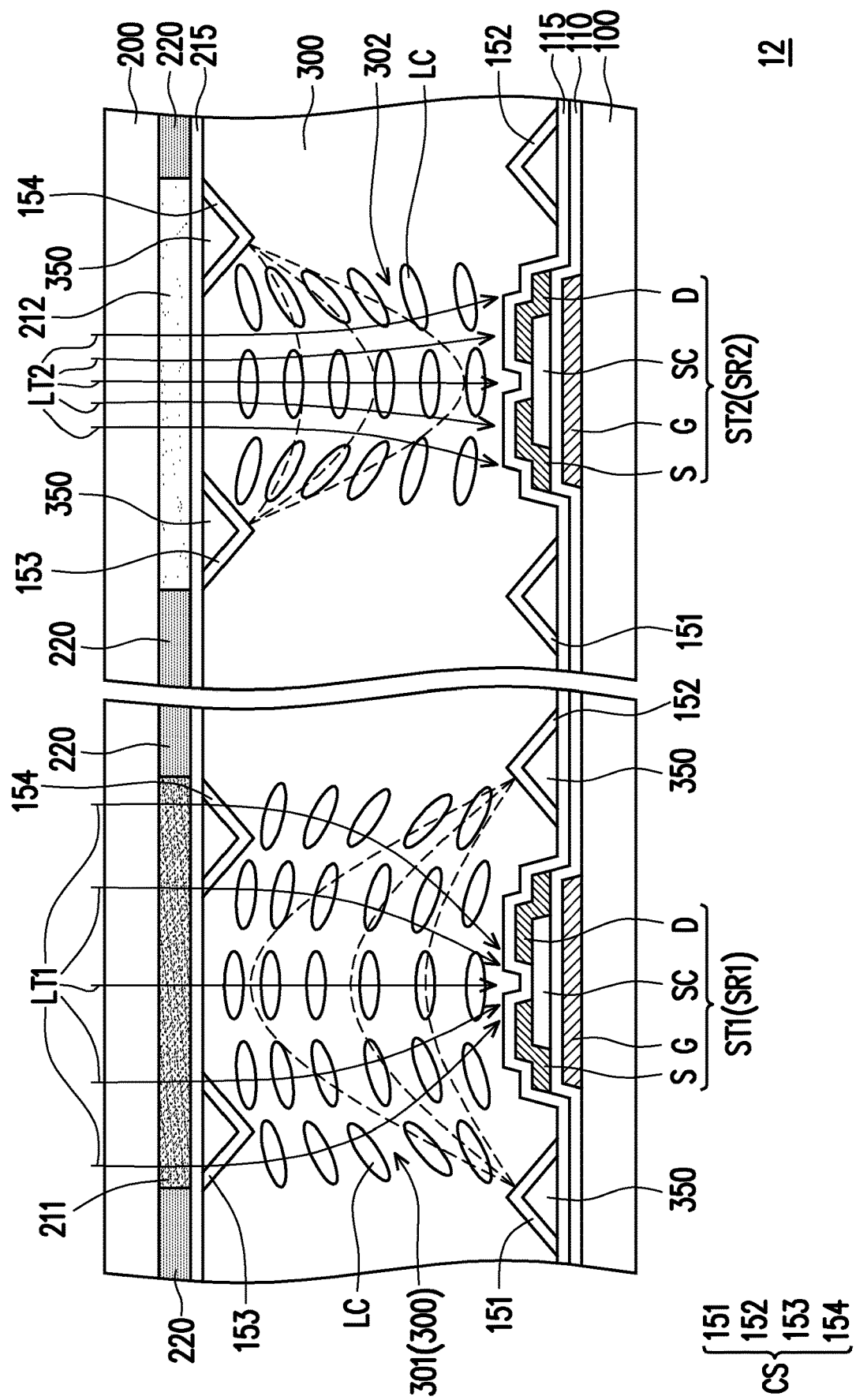
FIG. 9 and FIG. 10 are schematic cross-sectional views of a display panel according to a third embodiment of the disclosure.

FIG. 9 and FIG. 10 are schematic cross-sectional views of a display panel according to a third embodiment of the disclosure. Referring to FIG. 9 and FIG. 10, a display panel 12 of the present embodiment mainly differs from the display panel 10 of the aforesaid embodiment in that a control structure CS of the display panel 12 has a different number of control electrodes. In the present embodiment, the control structure CS includes the first control electrode 151, the second control electrode 152, the third control electrode 153 and the fourth control electrode 154, wherein the first control electrode 151 and the second control electrode 152 are located between the first substrate 100 and the display medium layer 300, and the third control electrode 153 and the fourth control electrode 154 are located between the second substrate 200 and the display medium layer 300. For example, two vertical projections of the third control electrode 153 and the fourth control electrode 154 on the first substrate 100 are located between two vertical projections of the first control electrode 151 and the second control electrode 152 on the first substrate 100. However, the disclosure is not limited thereto. In other embodiments, the first control electrode 151 and the third control electrode 153 may be aligned with each other in the normal direction of the first substrate 100, and the second control electrode 152 and the fourth control electrode 154 may be aligned with each other in the normal direction of the first substrate 100.

Referring to FIG. 9, when the first modulation portion 301 above the first sensing active device ST1 is required to provide the light focusing effect, a potential difference is provided between the first control electrode 151 and the second control electrode 152 of the corresponding control structure CS, and the third control electrode 153 and the fourth control electrode 154 may have a floating potential. When the second modulation portion 302 above the second sensing active device ST2 is required to provide the light diffusion effect, another potential difference is provided between the third control electrode 153 and the fourth control electrode 154 of the corresponding control structure CS, and the first control electrode 151 and the second control electrode 152 may have a floating potential.

Referring to FIG. 10, when the first modulation portion 301 between the first sensing active device ST1 and the first color filter pattern 211 is required to provide a stronger light diffusion effect, the third control electrode 153 and the fourth control electrode 154 of the corresponding control structure CS may have a first potential, the first control electrode 151 and the second control electrode 152 may have a second potential, and the first potential is different from the second potential. At this moment, most power lines roughly extend from the first substrate 100 to the second substrate 200, and the liquid crystal molecules LC tend to be arranged along the extension direction of the power lines (as shown by dash lines in FIG. 10). Since the partial light beam LT1 of external light beam diffuses after passing through the first modulation portion 301, the intensity of the light irradiating the first sensing active device ST1 is significantly reduced, thereby suppressing the generation of photocurrent. In other words, the first modulation portion 301 at this moment prevents the first sensing active device ST1 from being enabled and thus the first sensing active device ST1 is in an off state. In this way, operational flexibility of the photosensor can be improved.

Further, the display panel 12 further includes a common electrode CE, wherein the display portion 303 of the display medium layer 300 is sandwiched between the pixel electrode PE and the common electrode CE. Particularly, in the present embodiment, the first control electrode 151, the second control electrode 152 and the pixel electrode PE may include the same material, and the third control electrode 153, the fourth control electrode 154 and the common electrode CE may include the same material; that is, the first control electrode 151, the second control electrode 152 and the pixel electrode PE may belong to the same film layer, and the third control electrode 153, the fourth control electrode 154 and the common electrode CE may belong to the same film layer. However, the disclosure is not limited thereto.

It is to be noted that in the present embodiment, the arrangement manner of the liquid crystal molecules LC of the display portion 303 of the display medium layer 300 that overlaps the pixel electrode PE and structural relationships of the display active device DT are also applicable to other embodiments disclosed in the disclosure.

Figure 11:
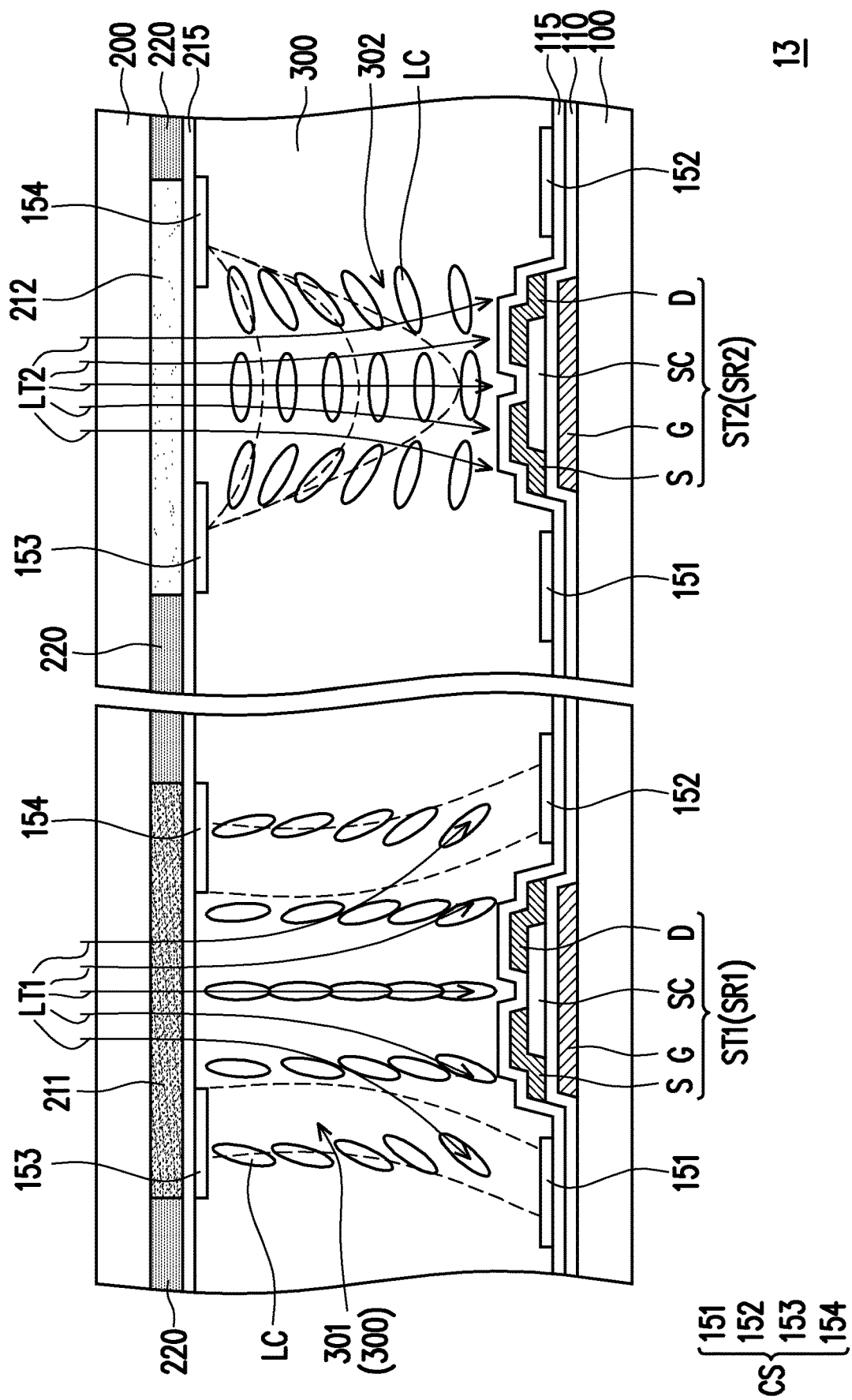
FIG. 11 is a schematic cross-sectional view of a display panel according to a fourth embodiment of the disclosure.

FIG. 11 is a schematic cross-sectional view of a display panel according to a fourth embodiment of the disclosure. Referring to FIG. 11, a display panel 13 of the present embodiment mainly differs from the display panel 12 of the aforesaid embodiment in that the display panel 13 has no protruding structure 350 (shown in FIG. 9). To simplify the manufacturing process, in the present embodiment, the first control electrode 151 and the second control electrode 152 of the control structure CS may be directly disposed on the first insulating layer 115, and the third control electrode 153 and the fourth control electrode 154 may be directly disposed on the second insulating layer 215.

In summary, the display panel according to an embodiment of the disclosure has two active devices disposed respectively in two pixel areas and used to sense a light beam. These two active devices are, for example, two sensing active devices, or a combination of a sensing active device and a compensation active device. Moreover, two modulation portions of the display medium layer that overlap these two active devices are respectively driven by two control structures, wherein one of the modulation portions is used to provide the light focusing characteristic and the other modulation portion is used to provide the light diffusion characteristic. Accordingly, intensities of two light beams received by these two active devices can be adjusted respectively, which contributes to an improvement in the signal-to-noise ratio (SNR) of the sensing circuit and an increase in design margin of the sensing structure. In addition, in the display panel of another embodiment of the disclosure, the modulation portion of the display medium layer that overlaps the sensing active device is driven by the control structure on the first substrate and the second substrate, so that a light beam passing through this modulation portion diffuses and cannot be received by the sensing active device and the sensing active device is thus prevented from being enabled. This contributes to an improvement in operational flexibility of the photosensor.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A display panel, having a plurality of pixel areas, the display panel comprising:
   a first substrate;
   a second substrate, disposed opposing the first substrate;
   a plurality of pixel structures, disposed on the first substrate and respectively located in the plurality of pixel areas;
   a sensing structure disposed on the first substrate, the sensing structure comprising a first photosensor and a second photosensor, the first photosensor comprising a first sensing active device located in one of the plurality of pixel areas and the second photosensor comprising a second sensing active device located in another of the plurality of pixel areas;
   a display medium layer, disposed between the first substrate and the second substrate and comprising a display portion overlapping the plurality of pixel structures, a first modulation portion overlapping the first sensing active device, and a second modulation portion overlapping the second sensing active device;
   a first control structure, disposed between the first substrate and the display medium layer and located on a periphery of the first modulation portion;
   a second control structure, disposed between the second substrate and the display medium layer and located on a periphery of the second modulation portion; and
   a plurality of color filter patterns, disposed in the plurality of pixel areas, wherein the first sensing active device overlaps a first color filter pattern among the plurality of color filter patterns, and the second sensing active device overlaps a second color filter pattern among the plurality of color filter patterns.

2. The display panel of claim 1, wherein the first color filter pattern further overlaps one of the plurality of pixel structures, and the second color filter pattern further overlaps another of the plurality of pixel structures.

3. The display panel of claim 1, wherein color of the first color filter pattern is red, and color of the second color filter pattern is blue or green.

4. The display panel of claim 1, wherein the first sensing active device has a first channel, the second sensing active device has a second channel, and a ratio of a width to a length of the first channel is greater than a ratio of a width to a length of the second channel.

5. The display panel of claim 1, wherein the plurality of color filter patterns are disposed between the second substrate and the display medium layer, the first modulation portion is located between the first color filter pattern and the first sensing active device, and the second modulation portion is located between the second color filter pattern and the second sensing active device.

6. The display panel of claim 1, wherein the first control structure comprises a first control electrode and a second control electrode, the first control electrode and the second control electrode are disposed on the first substrate, the first modulation portion is located between the first control electrode and the second control electrode, the second control structure comprises a third control electrode and a fourth control electrode, the third control electrode and the fourth control electrode are disposed on the second substrate, and the second modulation portion is located between the third control electrode and the fourth control electrode.

7. The display panel of claim 6, wherein the display medium layer comprises a plurality of positive liquid crystal molecules.

8. The display panel of claim 6, further comprising a plurality of protruding structures, wherein the first control electrode, the second control electrode, the third control electrode and the fourth control electrode are respectively disposed on the plurality of protruding structures and located between the plurality of protruding structures and the display medium layer.

9. A display panel, having a plurality of pixel areas, the display panel comprising:
    a first substrate;
    a second substrate, disposed opposing the first substrate;
    a plurality of pixel structures, disposed on the first substrate and respectively located in the plurality of pixel areas;
    a photosensor disposed on the first substrate, the photosensor having a sensing active device located in one of the plurality of pixel areas and a compensation active device located in another of the plurality of pixel areas, the sensing active device being electrically connected to the compensation active device;
    a display medium layer, disposed between the first substrate and the second substrate and comprising a display portion overlapping the plurality of pixel structures, a first modulation portion overlapping the sensing active device, and a second modulation portion overlapping the compensation active device;
    a first control structure, disposed between the first substrate and the display medium layer and located on a periphery of the first modulation portion;
    a second control structure, disposed between the second substrate and the display medium layer and located on a periphery of the second modulation portion; and
    a plurality of color filter patterns, disposed in the plurality of pixel areas, wherein the sensing active device overlaps a first color filter pattern among the plurality of color filter patterns, and the compensation active device overlaps a second color filter pattern among the plurality of color filter patterns.

10. The display panel of claim 9, wherein the first color filter pattern further overlaps one of the plurality of pixel structures, and the second color filter pattern further overlaps another of the plurality of pixel structures.

11. The display panel of claim 9, wherein color of the first color filter pattern is one of blue and green, and color of the second color filter pattern is the other of blue and green.

12. The display panel of claim 9, wherein the plurality of color filter patterns are disposed between the second substrate and the display medium layer, the first modulation portion is located between the first color filter pattern and the sensing active device, and the second modulation portion is located between the second color filter pattern and the compensation active device.

13. The display panel of claim 9, wherein the first control structure comprises a first control electrode and a second control electrode, the first control electrode and the second control electrode are disposed on the first substrate, the first modulation portion is located between the first control electrode and the second control electrode, the second control structure comprises a third control electrode and a fourth control electrode, the third control electrode and the fourth control electrode are disposed on the second substrate, and the second modulation portion is located between the third control electrode and the fourth control electrode.

14. The display panel of claim 13, wherein the display medium layer comprises a plurality of positive liquid crystal molecules.

15. The display panel of claim 13, further comprising a plurality of protruding structures, wherein the first control electrode, the second control electrode, the third control electrode and the fourth control electrode are respectively disposed on the plurality of protruding structures and located between the plurality of protruding structures and the display medium layer.

16. A display panel, having a plurality of pixel areas, the display panel comprising:
    a first substrate;
    a second substrate, disposed opposing the first substrate;
    a plurality of pixel structures, disposed on the first substrate and respectively located in the plurality of pixel areas;
    a photosensor, disposed on the first substrate, the photosensor having a sensing active device located in one of the plurality of pixel areas;
    a display medium layer, disposed between the first substrate and the second substrate and comprising a display portion overlapping the plurality of pixel structures and a modulation portion overlapping the sensing active device;
    a control structure, comprising a first control electrode, a second control electrode, a third control electrode and a fourth control electrode, the first control electrode and the second control electrode being disposed between the first substrate and the display medium layer, the third control electrode and the fourth control electrode being disposed between the second substrate and the display medium layer, wherein the modulation portion is located between the first control electrode and the second control electrode, and the modulation portion is located between the third control electrode and the fourth control electrode; and
    a plurality of color filter patterns, disposed in the plurality of pixel areas, wherein the modulation portion overlaps one of the plurality of color filter patterns.

17. The display panel of claim 16, wherein the one of the plurality of color filter patterns overlapped by the modulation portion further overlaps one of the plurality of pixel structures.

18. The display panel of claim 16, wherein the plurality of color filter patterns are disposed between the second substrate and the display medium layer, and the modulation portion is located between the one of the plurality of color filter patterns and the sensing active device.

19. The display panel of claim 16, further comprising a plurality of protruding structures, wherein the first control electrode, the second control electrode, the third control electrode and the fourth control electrode are respectively disposed on the plurality of protruding structures and located between the plurality of protruding structures and the display medium layer.

20. The display panel of claim 16, wherein each of the plurality of pixel structures has a pixel electrode and a common electrode, the pixel electrode, the first control electrode and the second control electrode belong to the same film layer, and the common electrode, the third control electrode and the fourth control electrode belong to the same film layer.

* * * * *